United States Patent
Taylor et al.

(10) Patent No.: US 7,523,434 B1
(45) Date of Patent: Apr. 21, 2009

(54) INTERFACING WITH A DYNAMICALLY CONFIGURABLE ARITHMETIC UNIT

(75) Inventors: Bradley L. Taylor, Santa Cruz, CA (US); Arvind Sundararajan, Mountain View, CA (US); Shay Ping Seng, San Jose, CA (US); L. James Hwang, Menlo Park, CA (US)

(73) Assignee: Xilinx, Inc., San Jose, CA (US)

( * ) Notice: Subject to any disclaimer, the term of this patent is extended or adjusted under 35 U.S.C. 154(b) by 255 days.

(21) Appl. No.: 11/234,490

(22) Filed: Sep. 23, 2005

(51) Int. Cl.
*G06F 17/50* (2006.01)
*H03K 17/693* (2006.01)

(52) U.S. Cl. .................. 716/16; 716/1; 716/17

(58) Field of Classification Search ............. 716/3, 716/16, 18, 1, 17; 712/200; 708/409
See application file for complete search history.

(56) References Cited

U.S. PATENT DOCUMENTS

| | | | |
|---|---|---|---|
| 5,568,630 A * | 10/1996 | Killian et al. ............ 712/200 |
| 5,801,958 A * | 9/1998 | Dangelo et al. ............ 716/18 |
| 5,854,929 A * | 12/1998 | Van Praet et al. .......... 717/156 |
| 5,896,521 A * | 4/1999 | Shackleford et al. ........ 703/21 |
| 5,963,730 A * | 10/1999 | Toyonaga et al. ............ 716/3 |
| 6,182,206 B1 * | 1/2001 | Baxter .................... 712/43 |
| 6,324,678 B1 * | 11/2001 | Dangelo et al. ............ 716/18 |
| 6,438,747 B1 * | 8/2002 | Schreiber et al. .......... 717/160 |
| 6,477,683 B1 * | 11/2002 | Killian et al. ............. 716/1 |
| 6,658,578 B1 * | 12/2003 | Laurenti et al. ........... 713/324 |
| 6,684,376 B1 * | 1/2004 | Kerzman et al. ............ 716/8 |
| 7,010,558 B2 * | 3/2006 | Morris ................... 708/409 |
| 7,036,106 B1 * | 4/2006 | Wang et al. ............... 716/18 |
| 2003/0005402 A1 * | 1/2003 | Bal ...................... 716/16 |
| 2003/0101429 A1 * | 5/2003 | Okada .................... 716/18 |
| 2004/0049759 A1 * | 3/2004 | Osann et al. .............. 716/16 |

OTHER PUBLICATIONS

U.S. Appl. No. 11/019,783, filed Dec. 21, 2004, Simkins et al.
Xilinx, Inc., "System Generator for DSP" Reference Guide, Release 9.2.01, Oct. 2007, pp. 118-126, available from Xilinx Inc., 2100 Logic Drive, San Jose, CA 95124.
Xilinx, Inc., "Designing with DSP48" Nov. 2007, pp. 1-22, available from Xilinx Inc., 2100 Logic Drive, San Jose, CA 95124.

* cited by examiner

*Primary Examiner*—Thuan Do
*Assistant Examiner*—Nha T Nguyen
(74) *Attorney, Agent, or Firm*—Kim Kanzaki; Kevin T. Cuenot (57) ABSTRACT

An exemplary embodiment includes a method that receives a plurality of mathematical expressions having a plurality of input variables. The mathematical expressions can then be parsed, checked for proper syntax and one or more abstract syntax trees can be formed. Next, the input variables are then assigned to input ports of the dynamically configurable arithmetic unit. Then using the parsed mathematical expressions with the assigned input ports, a list of operations to be performed by the dynamically configurable arithmetic unit are determined. And lastly, an interface to the dynamically configurable arithmetic unit is generated using in part the variable-to-input port assignments and the list of operations.

9 Claims, 9 Drawing Sheets

```
DECLARE PORTA_USED = FALSE, PORTB_USED = FALSE, PORTC_USED = FALSE
DECLARE ERROR_STRING = "Trying to map more then one symbolic identifier to the
same port"

MAP_PORTS (NODE)
IF NODE.HAS_CHILDREN
      CHILDREN = NODE.CHILDREN
         FOR I=1 TO LENGTH(CHILDREN)
            MAP_PORTS (CHILDREN[I])
         END
ELSE
      COMMENT : The Node is a leaf NODE
      SYM_IDENTIFIER = NODE.VALUE
      IF SYM_IDENTIFIER IS RESERVED
            RETURN
      END
      IF SYM_IDENTIFIER IS DEFINED IN PORTA
            IF PORTA_USED
                  PRINT ERROR_STRING
                  RETURN
            END
            PORTA_USED = TRUE
            NODE.VAL = A
               RETURN
      END IF SYM_IDENTIFIER IS DEFINED IN PORTB
            IF PORTB_USED
                  PRINT ERROR_STRING
                  RETURN
            END
            PORTB_USED = TRUE
            NODE.VAL = B
               RETURN
      END IF SYM_IDENTIFIER IS DEFINED IN PORTC
            IF PORTC_USED
                  PRINT ERROR_STRING
                  RETURN
            END
            PORTC_USED = TRUE
            NODE.VAL = C
               RETURN
      END
END
```

INTERFACING WITH A DYNAMICALLY CONFIGURABLE ARITHMETIC UNIT

REFERENCE TO A COMPUTER PROGRAM LISTING APPENDIX

This application includes a computer program-listing appendix on a single compact disc, the contents of which are incorporated herein by reference in their entirety. The compact disc contains a 161 KB file entitled "synthmodel_D-SPE.txf", which was created on Sep. 16, 2005. A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to computer design and more specifically, to implementing a symbolic specification using a dynamically configurable arithmetic unit.

BACKGROUND

Programmable logic devices (PLDs) are a well-known type of integrated circuit (IC) that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Some FPGAs, such as the Virtex FGPA from Xilinx Inc. of San Jose, Calif., can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, digital signal processing (DSP) functions, memories, storage elements, and math functions. Cores can also be parameterizable, i.e., allowing the user to enter parameters to activate or change certain core functionality.

Traditionally, the user of these cores, and in particular cores that perform arithmetic functions, need to specify the details of how their arithmetic expressions can be implemented on the core. More specifically, some of the details that needed to be explicitly specified by the user are connectivity of inputs using multiplexers; alignment of the input data types to match the arithmetic precision of the core; and pipelining of the data.

Therefore, there is a need for improved techniques for reducing the implementation detail required of a user to execute arithmetic expressions on an IC.

SUMMARY

The present invention relates generally to a method and system for implementing a symbolic specification having mathematical expressions using a dynamically configurable arithmetic unit. An exemplary embodiment of the present invention includes a method that receives a plurality of mathematical expressions having a plurality of input variables. The mathematical expressions can then be parsed, checked for proper syntax and one or more abstract syntax trees can be formed. Next, the input variables are then assigned to input ports of the dynamically configurable arithmetic unit. Then using the parsed mathematical expressions with the assigned input ports, a list of operations to be performed by the dynamically configurable arithmetic unit are determined. And lastly, an interface to the dynamically configurable arithmetic unit is generated using at least in part the variable-to-input port assignments and the list of operations.

In one embodiment the dynamically configurable arithmetic unit is a digital signal processing (DSP) unit having a multiplier coupled to an adder via a multiplexer, where the multiplexer is programmed by an opmode stored in a register. The DSP unit may also include registers which may be bypassed depending upon the setting of configuration memory cells. In one aspect the dynamically configurable arithmetic unit is a DSP unit that is programmed in the programmable logic and programmable interconnect of an integrated circuit (IC). In other aspects the dynamically configurable arithmetic unit may be a processor including a general microprocessor or a digital signal processor or a math co-processor, a multiplier, or any other unit that can perform a mathematical function.

Another embodiment of the present invention includes an interface to a dynamically configurable arithmetic unit. The interface, comprises i) a plurality of data alignment modules, where each data alignment module receives a plurality of input variables, wherein the input variables are associated with one or more arithmetic expressions; ii) a plurality of multiplexers coupled to the data alignment modules, wherein a data alignment module has a plurality of outputs coupled to a first multiplexer, the first multiplexer having a selection line and an output coupled to an input port of the dynamically configurable arithmetic unit; and iii) a second multiplexer having a plurality of input instructions and the selection line, where each instruction being associated with one of the arithmetic expressions and having an operation to be performed by the dynamically configurable arithmetic unit.

The present invention will be more full understood in view of the following description and drawings.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

In one embodiment of the present invention a computer tool is disclosed which allows a user to implement his arithmetic expressions in a dynamically configurable arithmetic unit of an IC having programmable logic and programmable interconnect, such as an FPGA. A user normally designs at a high level such as mathematical expressions, for example, a finite impulse response (FIR) equations. These mathematical expressions need to be transformed into a circuit design implemented on, for example, the Virtex-4 FPGA from Xilinx Inc. (see FIG. 1) in order for them to be useful. While the Virtex-4 provides hardwired digital signal processing elements (see FIGS. 1 and 2) and Virtex-2 has DSP cores (i.e., softcore digital signal processing elements, see Appendix), there is a significant effort in implementing the, for example, FIR equations in the DSP elements either hardwired or softcore. The computer tool significantly improves the user's ability to implement the user's mathematical, including arithmetic, expressions or equations using one or more DSP elements.

Figure 1:
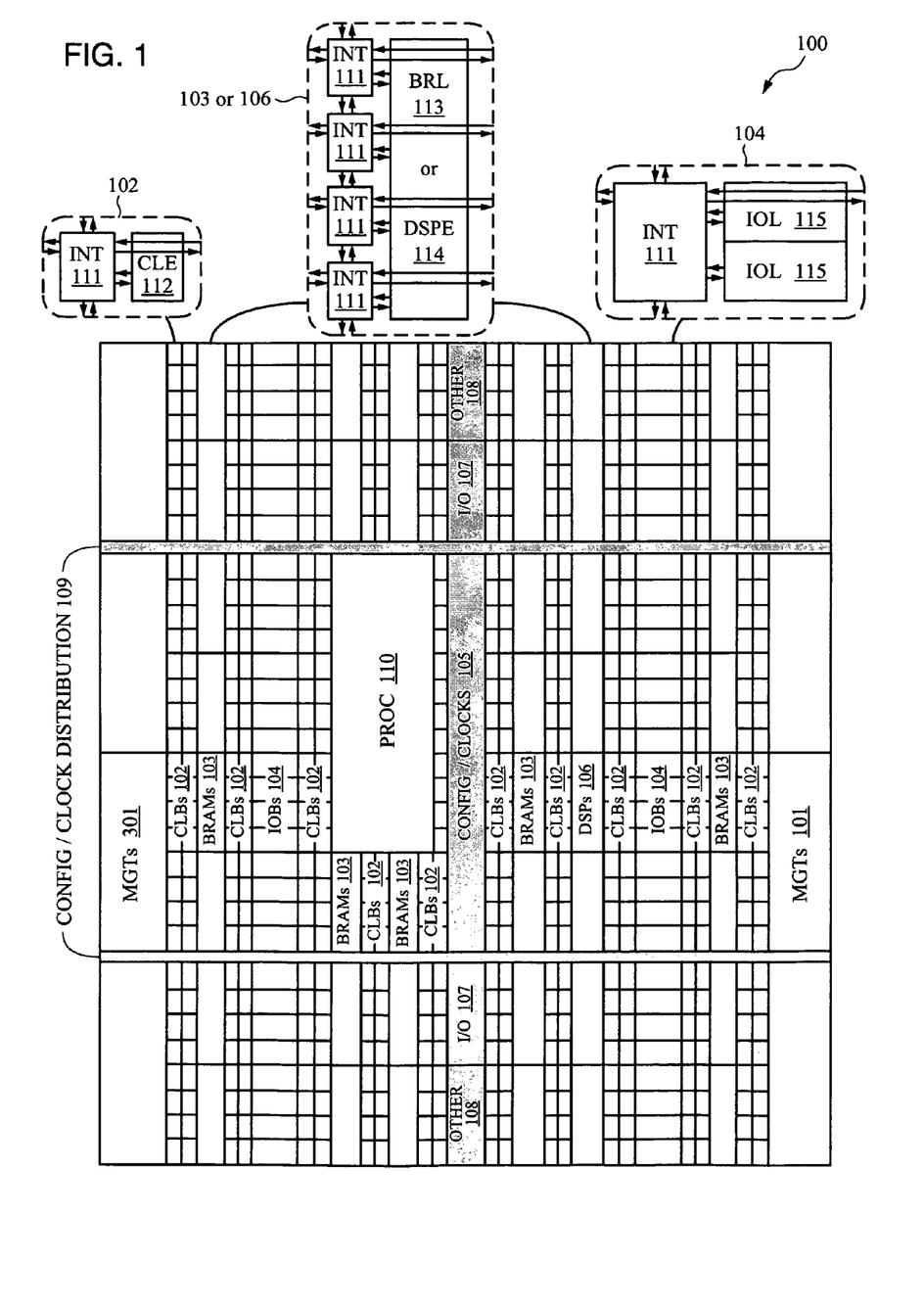
FIG. 1 illustrates an FPGA architecture that can be used to implement an embodiment of the present invention.

FIG. 1 illustrates an FPGA architecture 100 that can be used to implement an embodiment of the present invention. FPGA 100 includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP element (DSPE 114) in addition to an appropriate number of programmable interconnect elements. In one embodiment as shown in further detail by FIG. 2, DSP tile 106 has two DSPEs, DSPE 114-1 coupled to DSPE 114-2. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
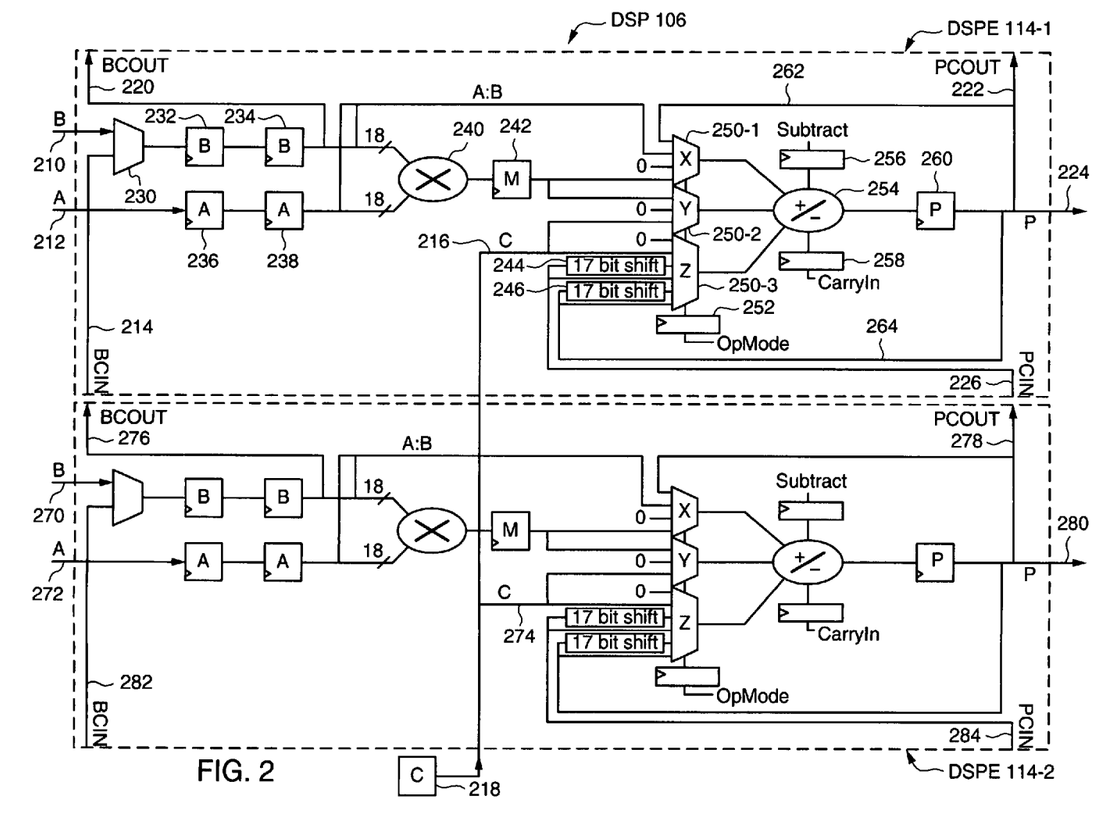
FIG. 2 illustrates a DSP block of FIG. 1 having two cascaded DSP elements.

FIG. 2 illustrates a DSP block 106 having two cascaded DSP elements (DSPE 114-1 and 114-2). The DSP elements, DSPE 114-1 and DSPE 114-2, have the same or similar structure, so only DSPE 114-1 will be described in detail. DSPE 114-1 is basically a multiplier 240 coupled to an adder/subtractor, herein after referred to as adder 254, via programmable multiplexers, X-Mux 250-1, Y-Mux 250-2, and Z-Mux 250-3 (collective multiplexers 250). The multiplexers 250 are dynamically programmed by an opmode stored in opmode register 252. A subtract register 256 controls whether the adder 254 does an addition (sub=0) or a subtraction (sub=1), e.g., C+A*B (sub=0) or C−A*B (sub=1). There is also a CarryIn register 258 connected to the adder 254 which has one or more carry in bits The output of adder 254 goes to P register 260, which has output P 224 and PCOUT 222. Output P 224 is also feedback to X-Mux 250-1 and to Z-Mux 250-3 either directly or via 17 bit shift register 246.

There are three external data inputs into DSPE 114-1, port A 212, port B 210, and port C 216 from C register 218. There two internal inputs, BCIN 214 (from BCOUT 276) and PCIN 226 (from PCOUT 278) from DSPE 114-2. Port B 210 and BCIN 214 go to multiplexer 230. The output of multiplexer 230 can either bypass both B registers 232 and 234, go to B register 232 and then bypass B register 234 or go to B register 232 and then B register 234 before going to multiplier 240 or X-Mux 250-1 (via A:B 228). Port A 212 can either bypass both A registers 236 and 238, go to A register 236 and then bypass A register 238 or go to A register 236 and then A register 238 before going to multiplier 240 or X-Mux 250-1 (via A:B 228). The 18 bit data on port A and 18 bit data on port B can be concatenated into A:B 228 to go to X-Mux 250-1. Which combination of A registers 236/238 for the A port 212 are used/bypassed and which combination of B registers 232/234 are used/bypassed for the output of multiplexer B, including the B port 210, is programmed by configuration memory cells attached to the select ports of A and B register multiplexers (not shown).

There is one external output port P 224 from P register 260 and two internal outputs BCOUT 220 and PCOUT 222, both of which go to another DSP element (not shown).

The multiplier 240 in one embodiment receives two 18 bit 2's complement numbers and produces the multiplicative product of the two inputs to M registers 242. The multiplicative product can be in the form of two partial products, each of which may be stored in an M register. The first partial product goes to the X-Mux 250-1 and the second partial product goes to Y-Mux 250-2. The X-Mux 150-1 also has a constant 0 input. The Y-Mux 250-2 also receives an input from the C register 218 and a constant 0 input. The Z-Mux receives input from the C register 218, constant 0, PCIN 226 or PCIN 226 shifted through a 17 bit shifter 244, P, and P shifted through a 17 bit shifter 246. The X-Mux 250-1, Y-Mux 250-2, and Z-Mux 250-3 are connected to the adder 254. In adder mode, A:B 228 is one input to adder 254 via X-Mux 250-1 and port C 216 is the second input to adder 254 via Z-Mux 250-3 (the Y-Mux 250-2 inputs 0 to the adder 254). In multiplier mode (A*B), the two partial products from M registers 242 are added together in adder 254. In addition in multiplier mode A*B can be added or subtracted from the C register 218 contents.

Listed below in Table 1 are the various opmodes that can be stored in opmode register 252. The opmode code is given in binary and hexadecimal. Next the function performed by DSPE 114-1 is given in a pseudo code format. Lastly the DSP mode: adder, multiplier or both is given.

TABLE 1

| Hex Opmode | Binary Opmode | Function | DSP Mode |
|---|---|---|---|
| 0x00 | 0000000 | P = Cin<br>P = +Cin<br>P = −Cin | Both |
| 0x02 | 0000010 | P = P + Cin<br>P = −P − Cin | Both |
| 0x03 | 0000011 | P = A:B + Cin | Adder Only |
| 0x05 | 0000101 | P = A * B + Cin<br>P = −A * B − Cin | Multiplier Only |
| 0x0c | 0001100 | P = C + Cin<br>P = −C − Cin | Both |
| 0x0e | 0001110 | P = +C + P + Cin<br>P = −C − P − Cin | Both |
| 0x0f | 0001111 | P = A:B + C + Cin<br>P = −A:B − C − Cin | Adder Only |
| 0x10 | 0010000 | P = PCIN + Cin<br>P = PCIN − Cin | Both |
| 0x12 | 0010010 | P = PCIN + P + Cin<br>P = PCIN − P − Cin | Both |
| 0x13 | 0010011 | P = PCIN + A:B + Cin<br>P = PCIN − A:B − Cin | Adder only |
| 0x15 | 0010101 | P = PCIN + A * B + Cin<br>P = PCIN − A * B − Cin | Multiplier Only |
| 0x1c | 0011100 | P = PCIN + C + Cin<br>P = PCIN − C − Cin | Both |
| 0x1e | 0011110 | P = PCIN + C + P + Cin<br>P = PCIN − P − C − Cin | Both |
| 0x1f | 0011111 | P = PCIN + A:B + C + Cin<br>P = PCIN − A:B − C − Cin | Adder Only |

TABLE 1-continued

| Hex Opmode | Binary Opmode | Function | DSP Mode |
|---|---|---|---|
| 0x20 | 0100000 | P = P − Cin | Both |
| 0x22 | 0100010 | P = P + P + Cin<br>P = P − P − Cin | Both |
| 0x23 | 0100011 | P = P − A:B − Cin<br>P = P + A:B + Cin | Adder Only |
| 0x25 | 0100101 | P = P + A * B + Cin | Multiplier Only |
| 0x2c | 0101100 | P = P + C + Cin<br>P = P − C − Cin | Both |
| 0x2e | 0101110 | P = P + C + P + Cin<br>P = P − C − P − Cin | Both |
| 0x2f | 0101111 | P = P + A:B + C + Cin<br>P = P − A:B − C − Cin | Adder Only |
| 0x30 | 0110000 | P = C − Cin | Both |
| 0x32 | 0110010 | P = C − P − Cin | Both |
| 0x33 | 0110010 | P = C − A:B − Cin | Adder Only |
| 0x35 | 0110101 | P = C − A * B − Cin | Multiplier Only |
| 0x3c | 0111100 | P = C + C + Cin<br>P = C − C − Cin | Both |
| 0x3e | 0111110 | P = C + C + P + Cin<br>P = C − C − P − Cin | Both |
| 0x50 | 1010000 | P = PCIN >> 17 + Cin,<br>P = PCIN >> 17Cin | Both |
| 0x52 | 1010010 | P = PCIN >> 17 + P + Cin<br>P = PCIN >> 17 − P − Cin | Both |
| 0x53 | 1010011 | P = PCIN >> 17 + A:B + Cin<br>P = PCIN >> 17 − A:B − Cin | Adder Only |
| 0x55 | 1010101 | P = PCIN >> 17 + A * B + Cin<br>P = PCIN >> 17 − A * B − Cin | Multiplier Only |
| 0x5c | 1011100 | P = PCIN >> 17 + C + Cin<br>P = PCIN >> 17 − C − Cin | Both |
| 0x5e | 1011110 | P = PCIN >> 17 + P + C + Cin<br>P = PCIN >> 17 − P − C − Cin | Both |
| 0x5f | 1011111 | P = PCIN >> 17 + C + A:B + Cin<br>P = PCIN >> 17 − C − A:B − Cin | Adder Only |
| 0x60 | 1010000 | P = P >> 17 + Cin<br>P = P >> 17 − Cin | Both |
| 0x62 | 1010010 | P = P >> 17 + P + Cin<br>P = P >> 17 − P − Cin | Both |
| 0x63 | 1010011 | P = P >> 17 + A:B + Cin<br>P = P >> 17 − A:B − Cin | Adder Only |
| 0x65 | 1010101 | P = P >> 17 + A * B + Cin<br>P = P >> 17 − A * B − Cin | Multiplier Only |
| 0x6c | 1011100 | P = P >> 17 + C + Cin<br>P = P >> 17 − C − Cin | Both |
| 0x6e | 1011110 | P = P >> 17 + P + C + Cin<br>P = P >> 17 − P − C − Cin | Both |
| 0x6f | 1011111 | P = P >> 17 + C + A:B + Cin<br>P = P >> 17 − C − A:B − Cin | Adder Only |

Further details of DSP 106 in FIG. 2 can be found in the Virtex-4 product from Xilinx, Inc, and from U.S. patent application Ser. No. 11/019,783, filed Dec. 21, 2004, entitled Programmable Logic Device with Cascading DSP Slices, by James M. Simkins, et. al., which is herein incorporated by reference.

In order to use DSPE 114-1 and/or DSPE 114-2 and/or multiple DSP 106s, an interface to the dynamically configurable arithmetic unit, for example, the DSP 106, needs to be formed in the programmable logic and programmable interconnect of the IC. For illustration purposes, let the dynamically configurable arithmetic unit be DSPE 114-1 in one embodiment. In other embodiments the dynamically arithmetic configurable unit may be any dynamic operator unit, a microprocessor, a hardwired arithmetic unit comprising a multiplier coupled to an adder, a digital signal processor, and a softcore digital signal processing element formed in the programmable logic of an integrated circuit.

Figure 3A:
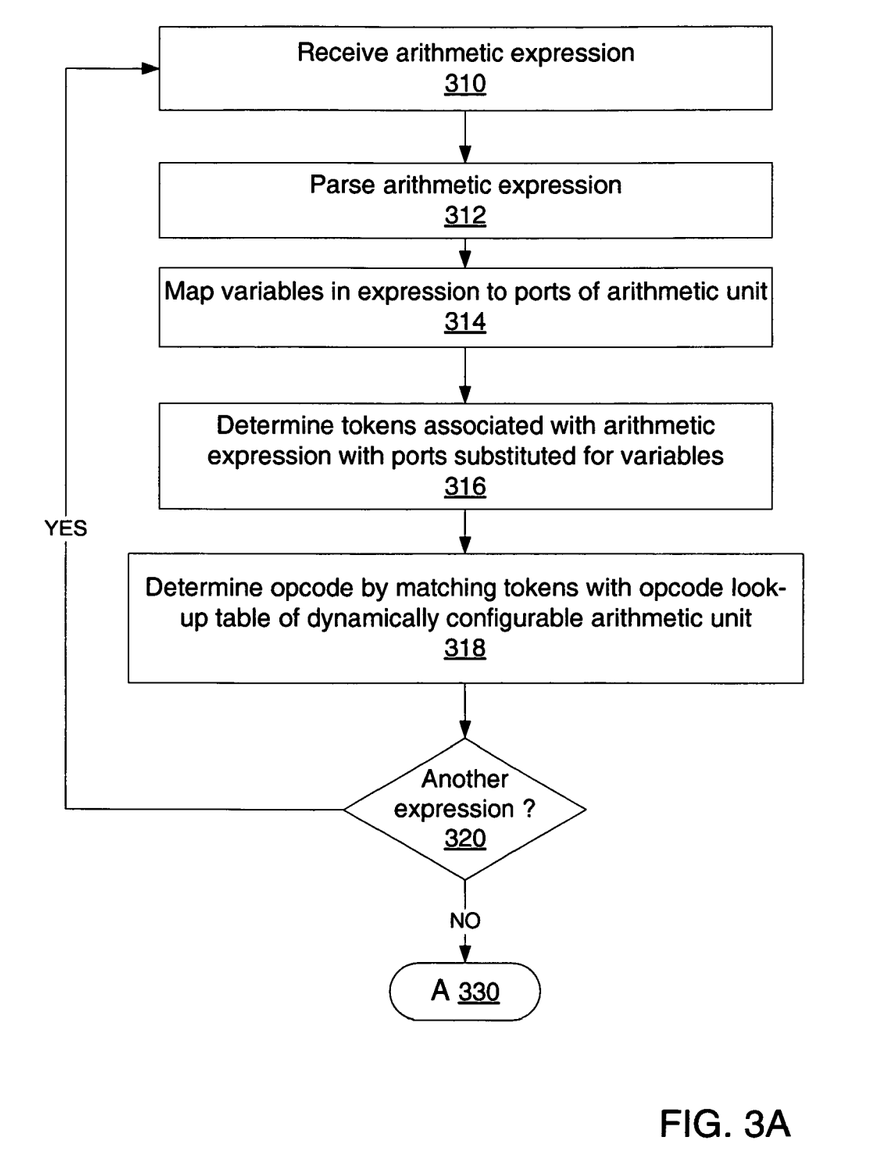
FIGS. 3A and 3B give a flowchart for forming an interface to a dynamically configurable unit of an embodiment of the present invention.

FIGS. 3A and B give a flowchart for forming an interface to a dynamically configurable arithmetic unit of an embodiment of the present invention. At step 310 the computer tool receives an arithmetic expression or equation such as P=a1*b2+c1. This expression is then parsed to form an abstract syntax tree (AST) at step 312. At step 314 the variables in the expression, e.g., P, a1, b2, and c1, are mapped to the ports of the dynamically configurable arithmetic unit, e.g., ports A, B, C, and P of DSPE 114-1. Using the AST and the port mapping, tokens are then determined at step 316. At step 318 the opcode, e.g., opmode, is determined by pattern matching the tokens with the opcode tokens in a look-up table such as Table 1 above. The loop at 320 is repeated until all the arithmetic expressions in the symbolic specification have been processed according to the above steps.

Figure 3B:
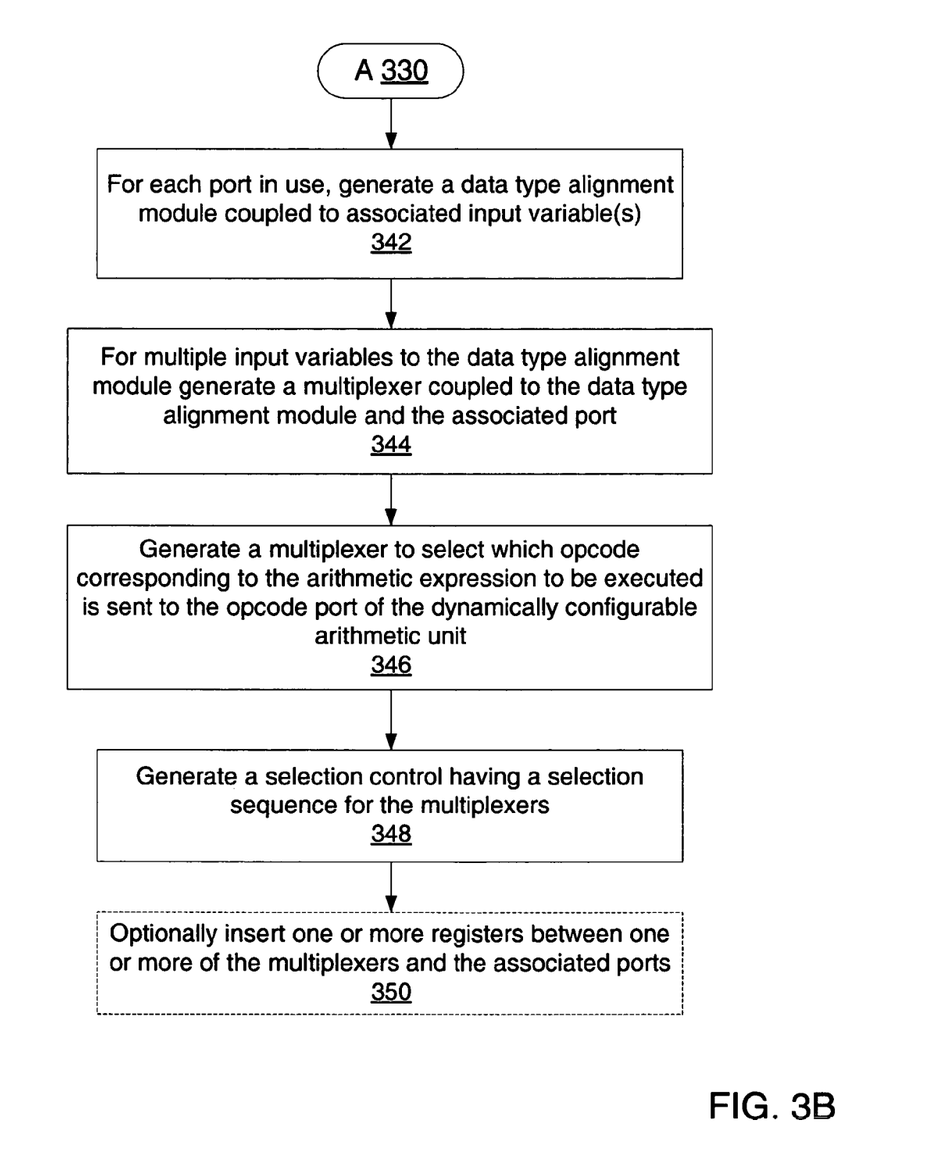
Figure 6:
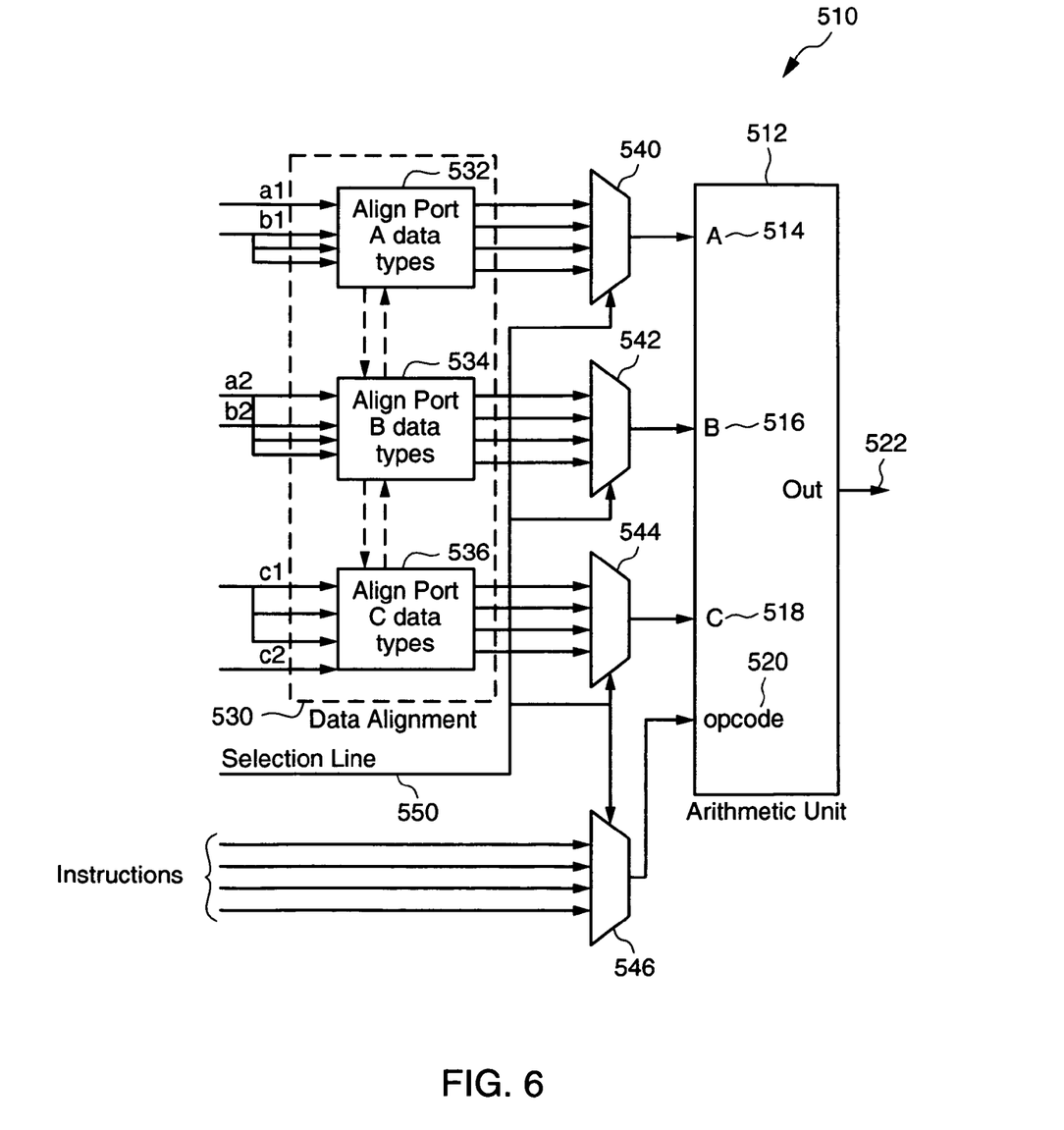
FIG. 6 shows the interface to arithmetic unit that is programmed in the programmable logic and interconnect of an IC of an embodiment of the present invention.

FIG. 3B then constructs an interface as shown in FIG. 6. For each port in use (e.g., A, B, C), a data type alignment module (e.g., 532, 534, and 536 of FIG. 6) coupled to associated input variable(s) (e.g., a1, a2, b1, b2, c1, c2) is created at step 342. For multiple input variables to the data type alignment module, multiplexers coupled to the data type alignment modules and the associated ports are generated at step 344 (e.g., for input variable a1 and a2 into alignment module 532, multiplexer 540 is generated). Next, at step 346, a multiplexer (e.g., 546) is generated to select which opcode corresponding to the arithmetic expression to be executed is sent to the opcode port (e.g., opcodes 520) of the dynamically configurable arithmetic unit, e.g., 512. At step 348 a selection control (see selection line 550 connected to a selection control circuit—not shown) having a selection sequence for the multiplexers (e.g., 540, 542, 544, 546) is generated. At optional step 350, optionally one or more registers are inserted between one or more of the multiplexers and the associated ports (see, for example, registers 760-768 of FIG. 8).

In order to illustrate the steps in FIG. 3A an example having the following 4 arithmetic expressions, in this case equations, are used:

|  |  |
|---|---|
| P = a1 * a2 | [1] |
| P = b1 * b2 + c1 | [2] |
| P = b1 * a2 | [3] |
| P = c2 − a2 * b1 | [4] |

For simplicity (at step 314 of FIG. 3A), input variables a1 and b1 are assigned, i.e., mapped, to port A 514 of the dynamically configurable arithmetic unit 512 (see FIG. 6); input variables a2 and b2 are assigned to port B 516; and input variables c1 and c2 are assigned to port C 518; The output variable P is assigned OUT 522.

Figure 4:
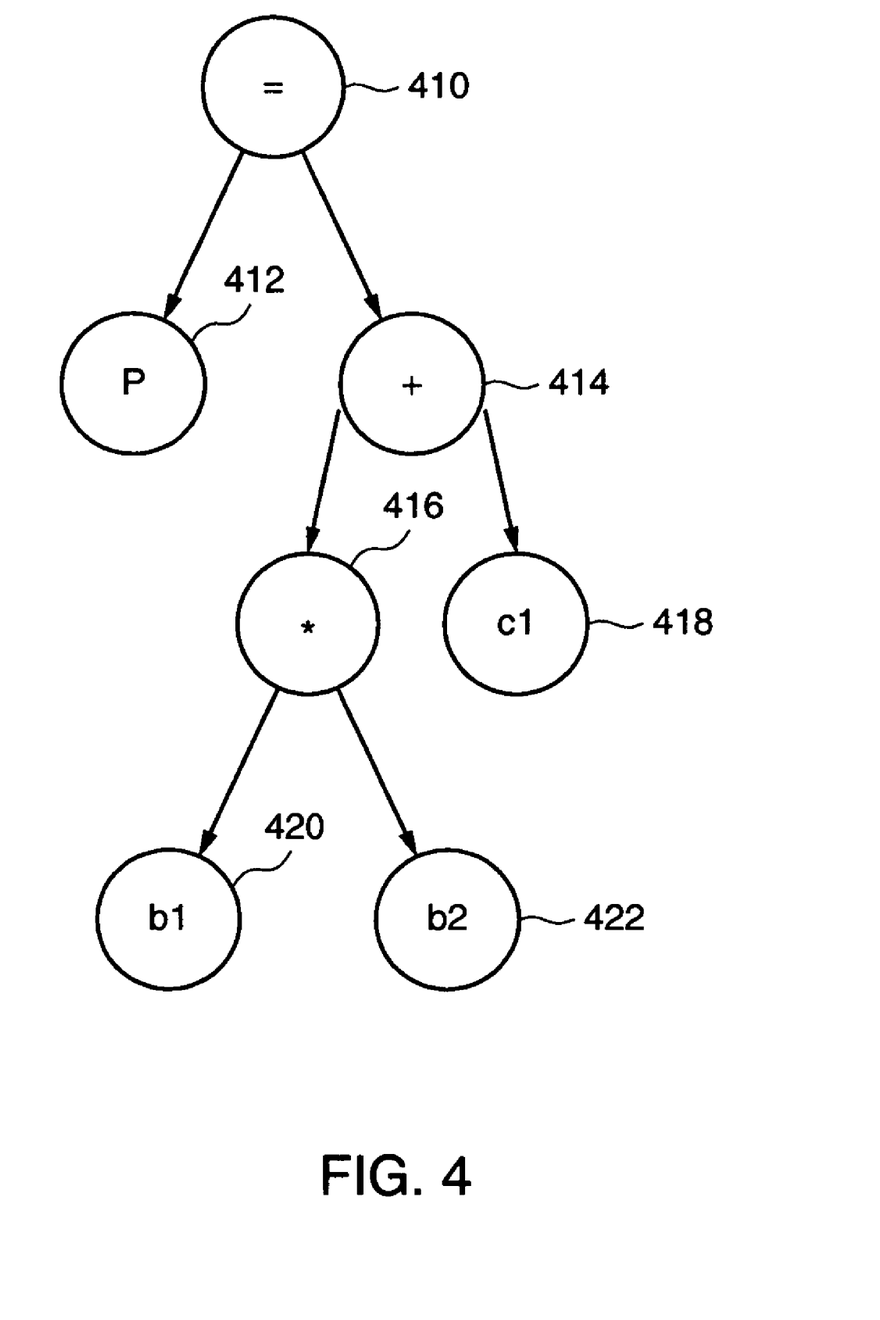
FIG. 4 shows an example of an abstract syntax tree (AST)

As an example of parsing (step 312), we use equation [2] above (step 312 of FIG. 3A), i.e., P=b1*b2+c1, to create the abstract syntax tree (AST) shown in FIG. 4. "=" is the root node 410. Children of node 410 are node P 412 and node "+" 414. the children of node 414 are node "*" 416 and leaf node "c1" 418. The children of node 416 are leaf node "b1" 420 and leaf node "b2" 422.

Figure 5:
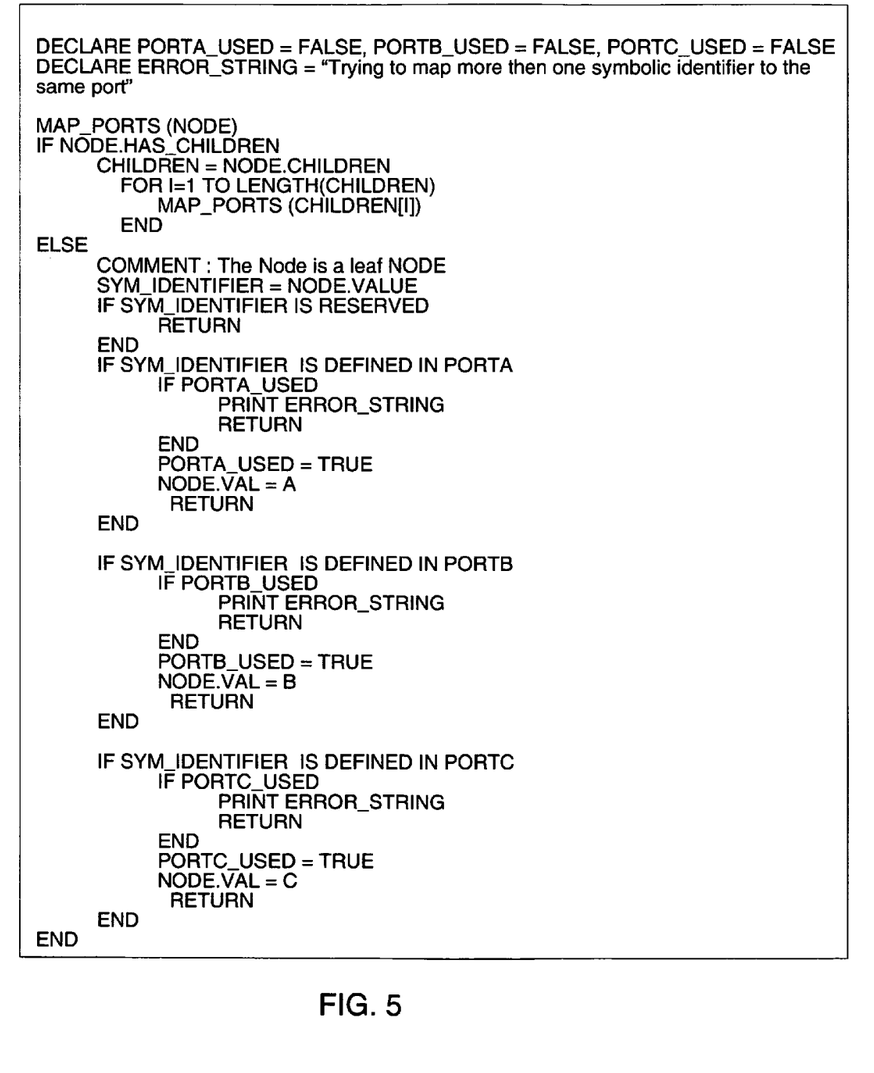
FIG. 5 shows an example of the pseudo-code that is used to map the ports to the variables.

Next, the pseudo-code of FIG. 5 is used to map the ports to the variables in equation [2]. In the pseudo-code of FIG. 5, NODE is a structure used to represent each node of the abstract syntax tree; VALUE is the string value, i.e., variable, in the leaf nodes representing the symbolic identifier; HAS_CHILDREN is set to true if the NODE is not a leaf node; and CHILDREN are an array of child nodes of a non-leaf node. Note P is mapped to OUT (not shown in FIG. 5).

The following is performed for the example above:
AST=PARSE("P=b1*b2+c1")
POST_MAP_PORT_RESULT=MAP_PORTS(AST)

where POST_MAP_PORT_RESULT has OUT=A*B+C

Next, tokens are determined based on the AST and certain predetermined rules (step 316). The predetermined rules are based on the opcodes. In this example, if we let, for illustration purposes, the dynamically configurable arithmetic unit 512 be a DSPE 114-1 of FIG. 2, then the opcodes 520 are the opmodes given in table 1 above. Based on the opmodes, some predetermined rules are that A*B is one token (the B token can only be used in this example in the context of the A*B token, hence there is no independent B token), and each token has an appended "+" or "−" sign. Thus the mapped symbols for the tokens of the AST for OUT=A*B+C are:
+A*B =>c
−A*B =>d
+A =>e
−A =>f
+C =>g
−C =>h
+OUT =>i
−OUT =>j Each token in +A*B+C is replaced with the mapped symbol to give "cg". The obtained pattern is alphabetically sorted and the resultant pattern is indexed into the look up table 1 to obtain the associated opmode which in this case is "0110101" or 0x35 hex with the subtract mode=0 and Cin=0; hence P=C+A*B (sub=0, Cin=0) for opmode 0x35 in Table 1 (step 318).

After the steps in FIG. 3A are completed the steps in FIG. 3B are performed. At step 342 the issue of alignment of the binary point for different input variables is addressed.

Because the DSPE 114-1 expects inputs to Port A to be 18 bit fixed point, Port B to be 18 bit fix point and Port C to be 48 bit fixed point, this restriction causes problems, when implementing finite impulse response filters, where the data type of input samples and coefficients are different. In one embodiment the interface aligns the binary points of the input data types entered in the DSP graphical user interface (GUI) 610—see FIG. 7. The bit-widths of each of the ports need to adhere to the requirements of the DSPE block. For example, in Multiplier mode, Port A and Port B can support a maximum of 18 bits (signed) and in Adder Mode, Port A can support a maximum of 36 bits (signed). Port C can support a maximum of 48 bits.

The following algorithm aligns multiple ports (A, B, and C) with varying binary point positions and bit widths onto the DSPE 114-1. This algorithm can be extended to other dynamically configurable arithmetic units with differing number of inputs and precision as well. The pseudo functions and variables used are as follows:

INSTR is an array of instructions defined for a particular dynamically configurable arithmetic unit. INSTR(N) refers to the operation performed by the dynamically configurable arithmetic unit when the value on the select line of the dynamically configurable arithmetic unit is N.

A_INPUT is an array of operands to port A of the dynamically configurable arithmetic unit. A_INPUT(N) is the operand to the dynamically configurable arithmetic unit, when the value on the select line of the dynamically configurable arithmetic unit is N. B_INPUT is an array of operands to port B of the dynamically configurable arithmetic unit. B_INPUT(N) is the operand to the dynamically configurable arithmetic unit, when the value on the select line of the dynamically configurable arithmetic unit is N. C_INPUT is an array of operands to port C of the dynamically configurable arithmetic unit. C_INPUT(N) is the operand to the dynamically configurable arithmetic unit, when the value on the select line of the dynamically configurable arithmetic unit is N.

MODE is a single input function that determines what mode the dynamically configurable arithmetic unit is in. Depending on the instruction the data widths on the input ports may require reinterpretation. For example, in DSPE the port A width is 36 bits wide if configured as an adder, else 18 bits wide if configured as a multiplier. BINARY_POINT is a single input function that determines the binary point location on the input. BIT_WIDTH is a single input function that determines the bit width of the input. MAX is a function that determines the maximum of the input integers, e.g., MAX(1, 2,3) equals 3.

```
The pseudo code for the alignment algorithm is:
define na = bit width of port a
define nb = bit width of port b
define nc = bit width of port c
define np = max(na,nb,nc)
define ninstr = number of instructions
global_n= 0
global_bin_pt = 0
comment : first pass each of the instruction inputs is aligned
for i = 1 to ninstr,
if mode(instr(i)) == add
   binpt_a = binary_point(a_input(i))
   binpt_c = binary_point(c_input(i))
   if max( binpt_a, binpt_c) > global_bin_pt
      global_bin_pt = max( binpt_a, binpt_c);
   end
   delta = binpt_c − binpt_a
   if delta > 0
      pad a_input(i) with delta zeros
   else
      pad c_input(i) with delta zeros
   end
end
if mode(instr(i)) == multiply
   binpt_a = binary_point(a_input(i))
   binpt_b = binary_point(b_input(i))
   binpt_c = binary_point(c_input(i))
   if max(binpt_a + binpt_b, binpt_c) > global_bin_pt
      global_bin_pt = max(binpt_a + binpt_b, binpt_c);
   end
   delta = binpt_c − (binpt_a + binpt_b)
   if delta > 0
      bits_left_in_a = na − bit_width(a_input(i))
      bits_left_in_b = nb − bit_width(b_input(i))
      if bits_left_in_a > delta
         pad a with delta zeros
      else
         pad a with bits_left_in_a zeros
         pad b with (delta-bits_left_in_a_zeros)
      end
   else
      pad c_input(i) with delta zeros
   end
end
end
comment: second pass inputs across instructions are now aligned.
for i = ninstr
binpt_c = binary_point(c_input(i))
delta = global_bin_pt − binpt_c
if mode(instr(i)) == add
   if delta > 0
      pad a with delta zeros
      pad c with delta zeros
   end
   if width(a_input(i) > na + nb)
      error("a port overflow")
   end
end
if mode(instr(i)) == multiply
   if delta > 0
      pad c with delta zeros
      bits_left_in_a = na − bit_width(a_input(i))
      bits_left_in_b = nb − bit_width(b_input(i))
      if bits_left_in_a > delta
         pad a with delta zeros
      else
         pad a with bits_left_in_a zeros
         pad b with (delta-bits_left_in_a) zeros
      end
   end
   if width(b_input(i) > nb)
      error("b port overflow")
   end
end
if width(c_input(i) > nc)
   error("c port overflow")
end
end
```

A first example illustrates the binary point alignment of the C port with the product of A*B. In the first example, the input variables are x, f, and c. The opmode for P=c+x*f results in aligning the binary points of c with the product (x*f). Hence c will be padded with 7 zeros.

Port A Parameters
   Number of bits: 17
   Binary Point: 7
   Arithmetic Type Unsigned
   Inputs to Port A: x
Port B Parameters
   Number of bits: 15
   Binary Point: 4
   Arithmetic Type: Unsigned
   Inputs to Port B: f
Port C Parameters
   Number of bits: 18
   Binary Point: 4
   Arithmetic Type: Unsigned
   Inputs to Port C: c
Mode: Multiplier
Opmode: P=c+x*f In a second binary point alignment example below, x (port A) will be padded with 3 zeros so as to align with c (port C) for opmode: P=c+x.

Port A Parameters
   Number of bits: 24
   Binary Point: 8
   Arithmetic Type: Unsigned
   Inputs to Port A: x
Port C Parameters
   Number of bits: 36
   Binary Point: 11
   Arithmetic Type: Unsigned
   Inputs to Port C: c
Mode:Adder
Opmode: P=c+x FIG. 6 shows the interface to arithmetic unit 512 that is programmed in the programmable logic and interconnect of an IC such as a PLD of an embodiment of the present invention. FIG. 6 is the result of performing the method of FIG. 3B or executing software that stores the method of FIG. 3B in a computer readable medium. From the example above, having the four equations [1]-[4], the inputs into the data alignment 530 are the input variables a1, a2, b1, b2, c1, and c2. For equation [1], for example, P=a1+b1 and variable a1 needs to be have its binary point aligned with variable b1 via align port A data types module 532 and align port B data types module 534. Aligned a1 will be passed to port a 514 via multiplexer 540, and aligned b1 will be passed to port B 516 via multiplexer 542. The instructions 552 have P=a1+b1 mapped to an opcode which will be passed to opcode port 520 via multiplexer 546. The selection line 550 will give the correct selections to Multiplexers 540, 542, and 546.

For equation [2], for example, P=a1+b2+c1 and variables a1, b2, and c1 need to have their binary points aligned via align port A data types module 532, align port B data types module 534 and align port C data types module 536. Aligned a1 will be passed to port A 514 via multiplexer 540; aligned b2 will be passed to port B 516 via multiplexer 542; and aligned c1 will be passed to port C 518 via multiplexer 544. The instructions 552 have P=a1+b2+c1 mapped to an opcode which will be passed to opcode port 520 via multiplexer 546. The selection line 550 will give the correct selections to Multiplexers 540, 542, 544, and 546. In one embodiment, the equation P=a1+b1 is executed first, followed sequentially by P=a1+b2+c1, and so forth. In other embodiments the order of execution is not sequential, but may be in any order or even concurrent.

In another embodiment, it is also possible to have de-multiplexed output (not shown) instead of single output OUT 522. This can be achieved by coupling a de-multiplexer to the output OUT 522 and driving the output to different lines depending on the output identifier specified in the instructions 522.

Figure 7:
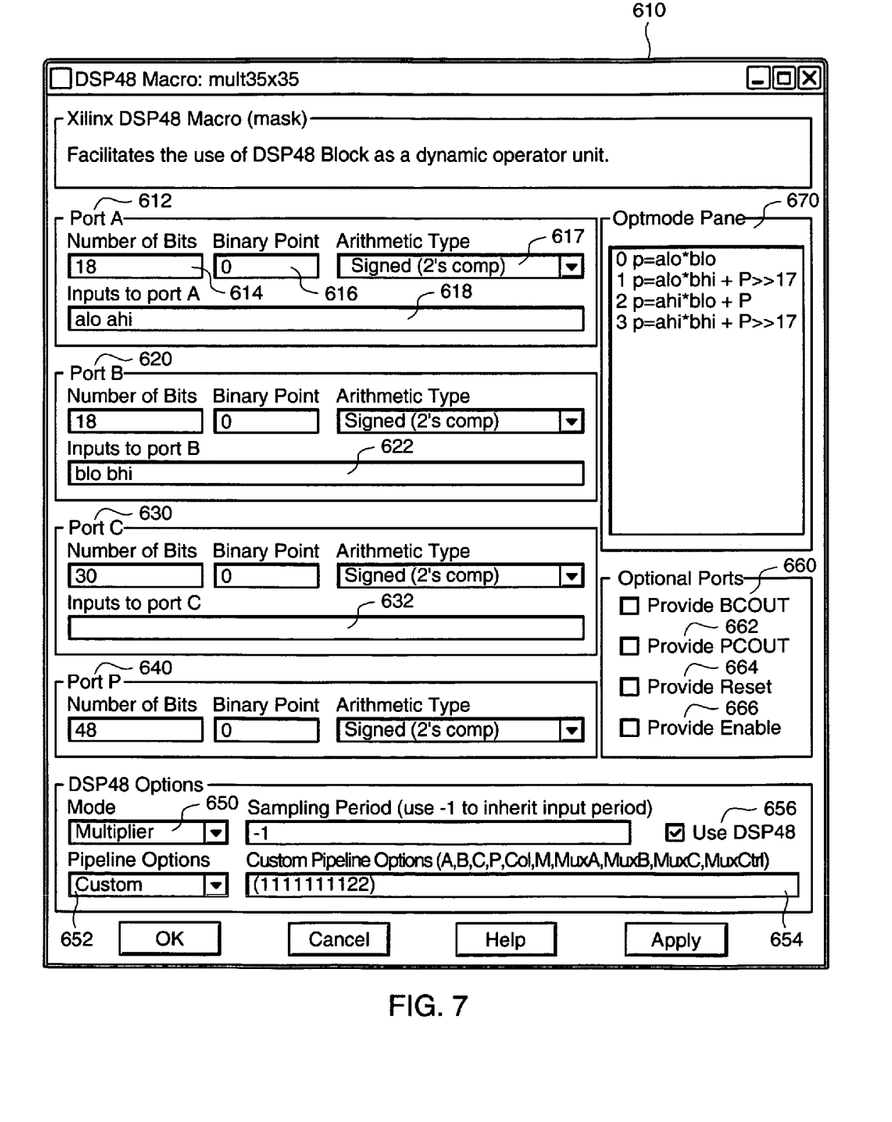
FIG. 7 shows an example of a graphical user interface (GUI) for the interface to the dynamically configurable arithmetic unit.

FIG. 7 shows an example of a graphical user interface (GUI) 610 for the interface to the dynamically configurable arithmetic unit, such as the DSP element 114-1. The GUI 610 has a variable number of inputs and outputs determined from user-specified parameter values. The input data ports are determined by the opmodes entered in the opmode pane 670 of the GUI 610. Input port Sel is created if more than one opmode is present in the opmode pane. Port P 640, an output data port, is the only port created in all configurations of the DSPE. Output ports PCOUT 662 and BCOUT 660 are created depending on the user-selections. Listed below in Table 2 are some of the fields in GUI 610 of FIG. 7 and how they relate to the interface to the DSPE 114-1.

TABLE 2

| | |
|---|---|
| Inputs to Port A 614 | Specifies symbolic port identifiers or operands appearing in the opmode pane as connected to port A or port A:B on the DSPE interface. |
| Inputs to port B 622 | Specifies symbolic port identifiers or operands appearing in the opmode pane as connected to port B. |
| Inputs to port C 632 | Specifies symbolic port identifiers or operands appearing in the opmode pane as connected to port C. |
| Mode 650 | Specifies the mode in which DSPE Interface operates. The options include 'Adder' and 'Multiplier'. When 'Adder' is selected, Inputs to Port B becomes inactive and Port A doubles up as Port A:B. The maximum width of Port A in Adder mode is 36 bits. When 'Multiplier' is selected, Inputs to Port B becomes active and maximum widths of Port A and Port B are 18 bits. |
| Pipeline Options 652 | Specifies the pipelining options on the DSPE Interface and latency on the data presented to each port of the DSPE. Available options include 'External Registers', 'No External Registers' and 'Custom'. When 'External Registers' is selected multiplexer outputs are registered. The latency of the DSPE Interface with the Pipeline Options set to 'External Registers' becomes four in 'Multiplier' mode and three in 'Adder' mode. When 'No External Registers' is selected, multiplexer outputs are not registered and the latency of the DSPE Interface becomes two. When 'Custom' is selected all register instances inside and outside of the DSPE are inferred from the input array in Custom Pipeline Options. |
| Custom Pipeline Options 654 | Active only when Pipeline Options is set to Custom. Accepts an array of integers specifying the pipeline options. Each element of the array specifies the pipelining depth of the associated field. |
| Use DSP48 656 | When selected, the hardwired DSPE is used to implement the DSPE, e.g., DSPE 114-1, otherwise a softcore of the DSPE based on embedded multipliers is used to implement the DSPE (see computer Appendix) |
| Provide BCOUT 660 | Provides an optional BCOUT port on the DSPE interface when selected. |
| Provide PCOUT 662 | Provides an optional PCOUT port on the DSPE interface when selected. |
| Provide Reset 664 | Provides an optional global Reset port when selected. |
| Provide Enable 666 | Provides an optional global Enable port when selected. |
| Opmode Pane 670 | Specifies the list of opmodes to be used in conjunction with the DSPE. |

The DSPE is capable of performing different arithmetic operations on input data depending on the input to its opmode port; this capability enables the DSPE to operate like a dynamic operator unit. In one embodiment the DSPE Interface simplifies using the DSPE as a dynamic operator unit. It orders multiple operands and opmodes with multiplexers and appropriately aligns signals on the data ports. The ordering of operands and opmode execution is determined by the order of opmodes entered in the Opmode Pane 670. The Opmode Pane 670 contains at least one opmode.

Listed in Table 3 below are the reserved port identifiers words that have special meaning associated with the DSPE interface, e.g., FIG. 8, and the DPSE 114-1 of FIG. 2.

TABLE 3

| Reserved Port Identifier | Port Type | Usage |
|---|---|---|
| PCIN | Input. Connected to port PCIN on the DSPE | This port appears depending on the opmode used. Refer to Table 1, Opmodes 0x10-0x1f use the PCIN Inport. The PCIN port must be connected to the PCOUT port of another DSPE. |
| BCIN | Input. Connected to port BCIN on the DSPE | This port appears if in any of the opmodes listed in Table 1, B(not A:B) is replaced with BCIN. |

TABLE 3-continued

| Reserved Port Identifier | Port Type | Usage |
|---|---|---|
| PCIN >> 17 | Input. Connected to port PCIN on the DSPE | Must be connected to the BCOUT port of another DSPE. Refer to Table 1. Opmodes 0x50-0x5f use this port identifier. PCIN, is right shifted by 17 and input to the DSPE adder through DSPE's Z multiplexer. |
| CIN | Input. Connected to port carry_in on the DSPE | This port appears if the opmode contains Cin. Refer to Table 1. Optional on all opmodes except 0x00. |
| PCOUT | Output. Connected to port PCOUT on the DSPE | This port appears if 'Provide PCOUT' on the GUI is selected. |
| BCOUT | Output. Connected to port BCOUT on the DSPE | This port appears if 'Provide BCOUT' on the GUI is selected. |
| RST | Input. Connected to rst on the DSPE as well as all registers' reset | This port appears if 'Provide Reset' on the GUI is selected. |
| EN | Input. Connected to en on the DSPE as well as all registers' enable | This port appears if 'Provide Enable' on the GUI is selected. |
| Sel | Input | Appears only when more than one instruction is specified in the Opmode Pane 670. Used to select an opmode from the list of opmodes in the opmode pane. |
| P | Output | Always present. |
| P >> 17 | — | Refer to Table 1. Opmodes 0x60-0x6f. P, right shifted by 17 is input to the DSPE adder through the DSPE's z multiplexer. |

Since the data paths for the A, B and C ports are different and can have a different number of registers, timing issues arise. There are three pipeline options available in the GUI 610 mask. These include 'External Registers', 'No External Registers' and 'Custom'.

The External Registers option aligns all the control and data signals using additional registers external to the DSPE. These external registers are required to register the output of the multiplexers to speed up the design. For example, an external second C register connected to C register 218 may be added, so that each of port A, B, and C has two input registers. With the pipeline option 652 set to 'External Registers' and the mode 650 set to 'Multiplier' the latency of the DSPE 114-1 is 4 (two port A, B, and C registers [232/234, 236/238, additional C/218], an M register 242, and a P register 260). When the Mode is set to 'Adder', the latency of the DSPE 114-1 is 3 (two port A, B, and C registers [232/234, 236/238, additional C/218], and a P register 260). This difference is the result of M register 242, which is selected when the DSPE is in multiplier mode, but bypassed in the adder mode.

For the No External Registers option all the control and data signals are aligned without using registers external to the DSPE. The latency is two for both 'Adder' and 'Multiplier' modes. The M register 242 is bypassed in this mode.

The Custom option gives the user control over instancing each register of the DSPE. When this option is selected the 'Custom Pipeline Options' field becomes active; a 10 element array indicates the pipeline options. The array elements correspond to the following ordered fields: [A B C P Ctrl M MuxA MuxB MuxC MuxCtrl], where:

'A' refers to the pipeline option on the DSPE 114-1 for port A 212. Legal values include 0, 1 and 2, which indicates 0, 1, or 2 A registers 236/238.

'B' refers to the pipeline option on the DSPE for port B/BCIN. Legal values include 0, 1 and 2, which indicates 0, 1, or 2 A registers 232/234.

'C' refers to the pipeline option on the DSPE for port C. Legal values include 0 and 1. This means 0 or 1 C register 218

'P' refers to the pipeline option on the DSPE for port C. Legal values include 0 and 1. This means 0 or 1 P register 224

'Ctrl' refers to all the control ports including opmode, subtract_sel, carryin and carryin_sel. Legal values include 0 and 1.

'MuxA' refers to the number of registers post multiplexer, e.g., 540 (FIG. 6) connected to Port A or Port A:B of the DSPE. Legal values include 0, 1 and 2.

'MuxB' refers to the number of registers post multiplexer, e.g., 542 mux_B connected to Port B of the DSPE. Legal values include 0, 1 and 2.

'MuxC' refers to the number of registers post multiplexer, e.g., 544, connected to Port C of the DSPE. Legal values include 0, 1 and 2.

'MuxCtrl' refers to the number of registers post multiplexers connected to control ports (mux_opmode, mux_subtract) and the carryin (mux_carryin) port of the DSPE. Legal values include 0, 1 and 2.

Figure 8:
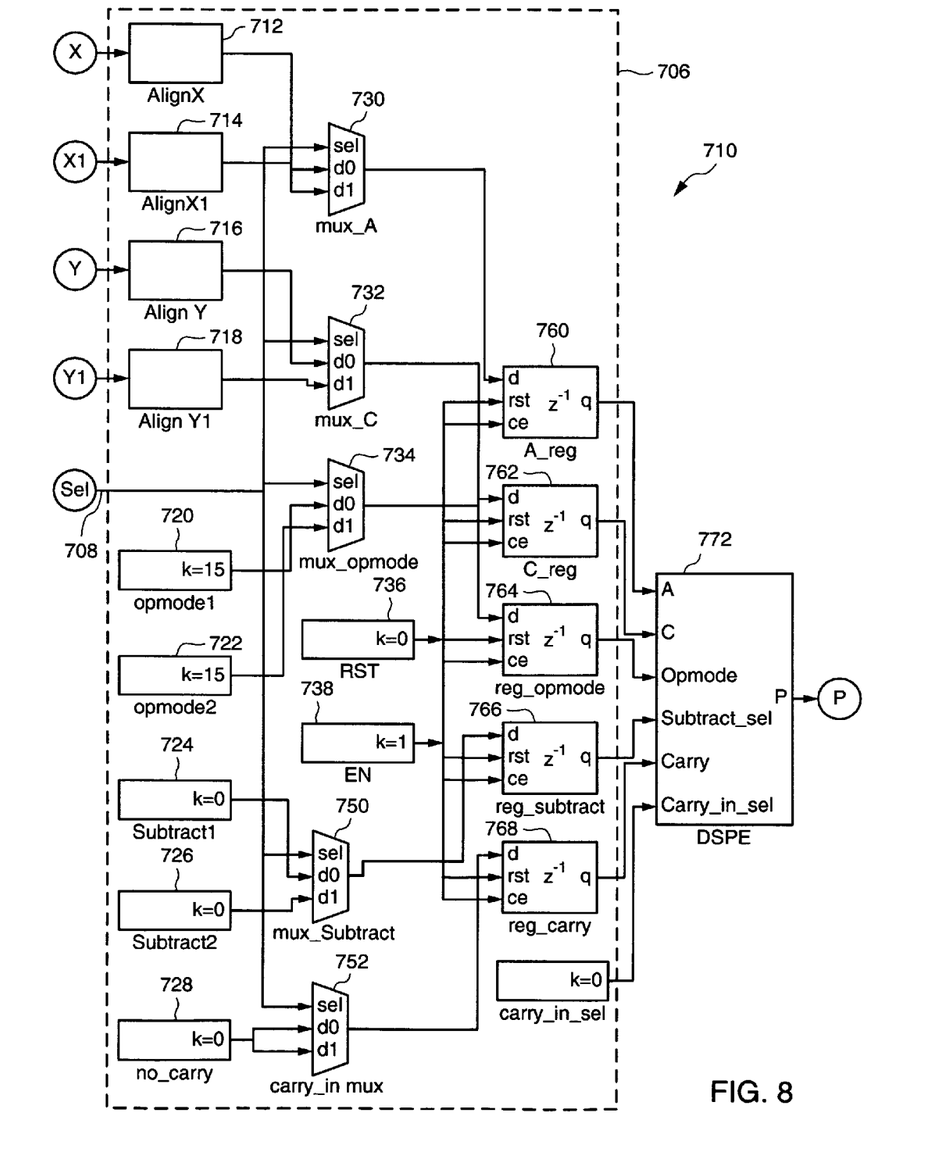
FIG. 8 shows another simplified example of an interface connected to a DSP element of an embodiment of the invention

FIG. 8 shows another simplified example of the interface 706 connected to a DSPE 772 of an embodiment of the invention. The interface 706 can be described in a hardware description language (HDL) such as Verilog or VHDL. Interface 706 includes four input variable x, x1, y, and y1 each having a corresponding binary point alignment module 712, 714, 716, and 718 respectively. Alignment modules 712 and 714 are connected to multiplexer 730. Alignment modules 716 and 718 are connected to multiplexer 732. Multiplexer 730 is connected to register 760 which in turn is connected to port A of DSPE 772. Multiplexer 732 is connected to register 762 which in turn is connected to port C of DSPE 772. Opmodes 1 and 2, 720 and 722 are connected to multiplexer 734 which is connected to the opmode port of DSPE 772 via register 764. Subtract register values 1 and 2, 724 and 726 are connected to multiplexer 750 which is connected to the subtract port of DSPE 772 via register 766. No carry value 728 is connected to multiplexer 752 which is connected to the carry port of DSPE 772 via register 768. Select signal 708 is connected to multiplexers 730, 732, 734, 750 and 752.

In some embodiments DSPE 772 can be a softcore programmed in the programmable logic and interconnect of a FPGA. An example of the VHDL code used to generate such as softcore is given in the computer appendix, which is herein incorporated by reference.

As can be seen from the above an embodiment of the present invention includes software stored in a computer readable medium for implementing a symbolic specification including arithmetic expressions, using a dynamically configurable arithmetic unit. The software includes: code for parsing a plurality of arithmetic expressions comprising a plurality of input variables; code for assigning the plurality of input variables to input ports of the dynamically configurable arithmetic unit; code for determining from the plurality of arithmetic expressions a list of operations to be performed by the dynamically configurable arithmetic unit in order to execute the plurality of arithmetic expressions; and code for generating an interface to the dynamically configurable arithmetic unit based in part on the assigning step and the list of operations. In addition the interface may include hardware description language (HDL) code and the dynamically configurable arithmetic unit may include a digital signal processing element in an integrated circuit having programmable logic and programmable interconnects.

While the above functionality has generally been described in terms of specific hardware and software, it would be recognized that the invention has a much broader range of applicability. For example, the software functionality can be further combined or even separated. Similarly, the hardware functionality can be further combined, or even separated. The software functionality can be implemented in terms of hardware or a combination of hardware and software. Similarly, the hardware functionality can be implemented in software or a combination of hardware and software.

Although the invention has been described in connection with several embodiments, it is understood that this invention is not limited to the embodiments disclosed, but is capable of various modifications, which would be apparent to one of ordinary skill in the art. Thus, the invention is limited only by the following claims.

What is claimed is:

1. A method for implementing a symbolic specification using dynamically configurable arithmetic unit, the method comprising:

receiving a plurality of mathematical expressions comprising a plurality of input variables;

generating the symbolic specification from the plurality of mathematical expressions, wherein the symbolic specification is devoid of hardware description;

assigning the plurality of input variables to input ports of the dynamically configurable arithmetic unit, wherein the dynamically reconfigurable arithmetic unit comprises a fixed number of components and a fixed number of input ports, wherein at least two input ports have different bit widths and at least two of the plurality of input variables have different binary point;

determining from the symbolic specification a list of operations to be performed by the dynamically configurable arithmetic unit in order to sequentially execute the plurality of mathematical expressions; and generating an interface to the dynamically configurable arithmetic unit based on at least in part the assigning step and the list of operations, wherein the interface performs an alignment of selected ones of plurality of input variables for each mathematical expression to be sequentially executed, wherein at least two consecutive alignments of the plurality of input variables are performed differently, and wherein each alignment is performed according to the binary point of the input variables and which input ports are to be multiplied or added together for the mathematical expression to be executed, wherein the generating the interface comprises creating one or more multiplexers; and wherein one or more multiplexers are formed in programmable logic in an integrated circuit device.

2. The method of claim 1 wherein generating the interface further comprises aligning data types of the plurality of input variables.

3. The method of claim 1 further comprising selectively using only registers external to the dynamically configurable arithmetic unit, wherein registers internal to the dynamically configurable arithmetic unit are bypassed, or using only registers internal to the dynamically configurable arithmetic unit to align input variables.

4. The method of claim 1 further comprising aligning the plurality of input variables by adding one or more registers coupled to the dynamically configurable arithmetic unit.

5. The method of claim 1 wherein the interface dynamically provides operations from the list of operations to the dynamically configurable arithmetic unit, wherein each operation specifies an alignment of selected ones of the plurality of variables and a function to be implemented by the dynamically configurable arithmetic unit using the selected variables thereby implementing the plurality of mathematical expressions, wherein the interface dynamically aligns the plurality of input variables according to the operation being provided and provides the aligned plurality of input variables to the input ports of the dynamically configurable arithmetic unit.

6. The method of claim 1 wherein the dynamically configurable arithmetic unit is a digital signal processing element, wherein the step of determining comprises, forming the list of operations by associating operational modes performed by the digital signal processing element to the plurality of mathematical expressions.

7. The method of claim 1 wherein the list of operations comprises a list of operational modes selected from a plurality of predetermined operational modes for the dynamically configurable arithmetic unit, wherein the step of determining comprises:

generating tokens from the symbolic specification;

mapping each token of the symbolic specification to an operational modes of the plurality of predetermined operational modes; and generating the list of operations according to the mapped opmodes of the dynamically configurable arithmetic unit.

8. A computer storage medium having written thereon computer-implementable instructions for implementing a method for symbolic specification using dynamically configurable arithmetic unit, the method comprising:

receiving a plurality of mathematical expressions comprising a plurality of input variables;

generating the symbolic specification from the plurality of mathematical expressions, wherein the symbolic specification is devoid of hardware description;

assigning the plurality of input variables to input ports of the dynamically configurable arithmetic unit, wherein the dynamically reconfigurable arithmetic unit comprises a fixed number of components and a fixed number of input ports, wherein at least two input ports have different bit widths and at least two of the plurality of input variables have different binary point;

determining from the symbolic specification a list of operations to be performed by the dynamically configurable arithmetic unit in order to sequentially execute the plurality of mathematical expressions; and generating an interface to the dynamically configurable arithmetic unit based on at least in part the assigning step and the list of operations, wherein the interface performs an alignment of selected ones of plurality of input variables for each mathematical expression to be sequentially executed, wherein at least two consecutive alignments of the plurality of input variables are performed differently, and wherein each alignment is performed according to the binary point of the input variables and which input ports are to be multiplied or added together for the mathematical expression to be executed, wherein the generating the interface comprises creating one or more multiplexers; and wherein one or more multiplexers are formed in programmable logic in an integrated circuit device.

9. The computer storage medium of claim 8 wherein the interface comprises hardware description language (HDL) code and the dynamically configurable arithmetic unit comprises a digital signal processing element in an integrated circuit having programmable logic and programmable interconnects.

* * * * *